(12) United States Patent
Nakagawa

(10) Patent No.: US 10,811,286 B2
(45) Date of Patent: Oct. 20, 2020

(54) LASER ANNEALING DEVICE AND LASER ANNEALING METHOD

(71) Applicant: SAKAI DISPLAY PRODUCTS CORPORATION, Sakai-shi, Osaka (JP)

(72) Inventor: Hidetoshi Nakagawa, Sakai (JP)

(73) Assignee: SAKAI DISPLAY PRODUCTS CORPORATION, Sakai-shi, Osaka (JP)

( * ) Notice: Subject to any disclaimer, the term of this patent is extended or adjusted under 35 U.S.C. 154(b) by 0 days.

(21) Appl. No.: 16/335,547

(22) PCT Filed: Sep. 28, 2016

(86) PCT No.: PCT/JP2016/078714
§ 371 (c)(1),
(2) Date: Jul. 3, 2019

(87) PCT Pub. No.: WO2018/061126
PCT Pub. Date: Apr. 5, 2018

(65) Prior Publication Data
US 2019/0348310 A1  Nov. 14, 2019

(51) Int. Cl.
*H01L 21/00* (2006.01)
*H01L 21/67* (2006.01)
(Continued)

(52) U.S. Cl.
CPC .. *H01L 21/67115* (2013.01); *H01L 21/02678* (2013.01); *H01L 21/268* (2013.01); *H01L 29/78672* (2013.01)

(58) Field of Classification Search
CPC ............ H01L 21/02678; H01L 21/268; H01L 21/67115; B23K 26/0608; B23K 26/082; H01S 5/4025
(Continued)

(56) References Cited

U.S. PATENT DOCUMENTS

| 7,033,434 | B2 | 4/2006 | Kim |
| 2004/0134417 | A1 | 7/2004 | Kim |
| 2008/0121626 | A1* | 5/2008 | Thomas ............. B23K 26/0738 219/121.62 |

FOREIGN PATENT DOCUMENTS

| JP | 2011-029411 A | 2/2011 |
| JP | 2011-233597 A | 11/2011 |

(Continued)

*Primary Examiner* — Brook Kebede
(74) *Attorney, Agent, or Firm* — ScienBiziP, P.C.

(57) ABSTRACT

Provided is a laser annealing device provided with an irradiation unit in which a plurality of lens arrays each comprising one or more lenses are arranged at a first interval, wherein, while scanning a substrate having: a plurality of first area arrays each of which comprises one or more areas to be irradiated and which are arranged at the first interval; and a plurality of second area arrays which are arranged apart from the first area arrays toward one side in a direction orthogonal to the first area arrays by a second interval smaller than the first interval, the irradiation unit irradiates the areas to be irradiated with a laser beam through the one or more lenses. At least one type of area array, in one pixel unit row that comprises a plurality of area arrays including the first and second area arrays, is irradiated with a laser by use of a lens array different from the ones used for the other types of area arrays.

5 Claims, 9 Drawing Sheets

(51) Int. Cl.
*H01L 21/02* (2006.01)
*H01L 21/268* (2006.01)
*H01L 29/786* (2006.01)

(58) Field of Classification Search
USPC .......................................................... 438/795
See application file for complete search history.

(56) References Cited

FOREIGN PATENT DOCUMENTS

JP         2012-243818 A     12/2012
WO    WO-2008024211 A2 *   2/2008   ........... H01S 5/4025

\* cited by examiner

LASER ANNEALING DEVICE AND LASER ANNEALING METHOD

TECHNICAL FIELD

The present invention relates to a laser annealing device and a laser annealing method using the laser annealing device.

BACKGROUND ART

In recent years, a thin film transistor (TFT) is used in a display panel. Specifically, an a-Si TFT using amorphous silicon (hereinafter referred to as a-Si) as a channel region, or a p-Si TFT using polysilicon (hereinafter referred to as p-Si) as a channel region is used as a thin film transistor of a display panel.

Patent Literature 1 discloses a method for producing a thin film transistor including: forming a gate electrode on a substrate; forming a gate insulting film on the gate electrode; forming an a-Si film on the gate insulating film; and forming a p-Si film in a channel region through crystallization of a-Si into p-Si by annealing the a-Si film through laser irradiation.

CITATION LIST

Patent Literature

[Patent Literature 1]
Japanese Patent Application Laid-Open Publication No. 2011-29411

SUMMARY OF INVENTION

Technical Problem

In the above-described method for producing a thin film transistor, a laser annealing device is used for annealing the a-Si film. In the laser annealing device, a laser beam emitted by a light source is partially shielded, and then, a plurality of irradiation target regions (regions requiring laser irradiation) disposed in a matrix on a substrate (a TFT substrate) of a display panel are irradiated with a laser beam through a microlens array in which a plurality of microlenses are disposed in a matrix. Here, the irradiation target region is a specific region of a thin film transistor in each of a plurality of pixel areas disposed on the substrate in a matrix, and specifically, a part of the a-Si film formed above the gate electrode.

In the laser annealing device, for example, with a column direction of the microlens array accorded with a column direction of the plural irradiation target regions disposed in a matrix, an irradiation section including the microlens array and the substrate are moved relatively with each other along the column direction so as to scan the substrate by the irradiation section, namely, so as to move the irradiation section above the substrate. Then, while scanning the substrate by the irradiation section, the laser annealing device irradiates, with a laser beam, the irradiation target regions disposed in positions corresponding to the microlenses.

Here, the laser annealing device cannot perform the laser irradiation of all the irradiation target regions of the substrate by a single scanning operation, and hence, a method in which the scan and the laser irradiation are performed with the substrate divided into a plurality of partial regions is generally employed. In other words, the laser annealing device performs the scan and the laser irradiation on a first partial region, then moves the irradiation section to a position corresponding to a second partial region before performing the scan and the laser irradiation of the second partial region.

When this method is employed, however, the following problem arises: In a single scanning operation, the positional relationship (particularly, the positional relationship in the row direction of the matrix) between a microlens and an irradiation target region corresponding to this microlens is not largely changed during the scan, and therefore, a distance between the microlens and the irradiation target region is kept substantially constant during the laser irradiation. Accordingly, a large difference is not caused in the degree of crystallization among a plurality of irradiation target regions to be subjected to the laser irradiation during the single scanning operation, and display characteristics of a plurality of pixel areas subjected to the laser irradiation during the single scanning operation, namely, a plurality of pixel areas included in one partial region, are substantially uniform.

On the other hand, between the first partial region and the second partial region, owing to influence of the movement of the irradiation section from a position corresponding to the first partial region to a position corresponding to the second partial region, a difference is caused in the positional relationship between one microlens and an irradiation target region corresponding to this microlens, and a difference is caused in a distance between the microlens and the irradiation target region in the laser irradiation. Accordingly, a difference is caused in the degree of crystallization of the irradiation target region between the first partial region and the second partial region, and a difference is caused in display characteristics of the pixel areas. As a result, when an image is displayed on the display panel, a seam between one partial region and an adjacent another partial region is conspicuous, and there arises a problem that the seam is easily visually recognized by a user.

The present invention was devised in consideration of these circumstances, and an object is to provide a laser annealing device and a laser annealing method that can make a seam between partial regions set in performing laser annealing difficult to be visually recognized by a user.

Solution to Problem

The laser annealing device according to the present invention is a laser annealing device including an irradiation section in which a plurality of lens columns each consisting of at least one lens are disposed at a first interval, for irradiating an irradiation target region with a laser beam through the lens while scanning a substrate by the irradiation section, the substrate including region columns each consisting of at least one irradiation target region, the region columns including a plurality of first region columns disposed at the first interval, and a plurality of second region columns disposed to be spaced from the first region columns at a second interval smaller than the first interval toward one side in a perpendicular direction to the region columns, and the laser annealing device includes: a light emitting section emitting a laser beam to be caused to enter the lens; a moving mechanism relatively moving the irradiation section and the substrate in a column direction along the lens columns with the column direction accorded with a direction along the region columns; and a control section controlling the light emitting section and the moving mechanism to irradiate, with a laser beam, the irradiation target region included in each of the region columns disposed in positions corresponding to any one of the lens columns through a lens included in a lens column corresponding to the region column while causing the irradiation section to scan the substrate in the column direction, and the control section controls the light emitting section and the moving mechanism to irradiate, with a laser beam, the irradiation target region included in one non-scan-end region column among the plurality of first region columns through the lens included in one lens column among the plurality of lens columns in first scan, controls the light emitting section and the moving mechanism to irradiate, with a laser beam, the irradiation target region included in a second region column closest to the one region column on the one side of the one region column through the lens included in any one of the lens columns excluding the one lens column in second or later scan, and controls the light emitting section and the moving mechanism to irradiate, with a laser beam, the irradiation target region included in a second region column closest to the one region column on an opposite side to the one side of the one region column through the lens included in any one of the lens columns excluding the one lens column in the second or later scan.

The laser annealing method of the present invention is a laser annealing method for irradiating an irradiation target region with a laser beam through a lens while scanning a substrate by an irradiation section in which a plurality of lens columns each consisting of at least one lens are disposed at a first interval, the substrate including region columns each consisting of at least one irradiation target region, the region columns including a plurality of first region columns disposed at the first interval, and a plurality of second region columns disposed to be spaced from the first region columns at a second interval smaller than the first interval toward one side in a perpendicular direction to the region columns, and the laser annealing method includes: while causing the irradiation section to scan the substrate by relatively moving the irradiation section and the substrate in a column direction along the lens columns with the column direction accorded with a direction along the region columns for irradiating, with a laser beam, the irradiation target region included in each of the region columns disposed in positions corresponding to any one of the lens columns through a lens included in a lens column corresponding to the region column; irradiating, with a laser beam, the irradiation target region included in one non-scan-end region column among the plurality of first region columns through the lens included in one lens column among the plurality of lens columns in first scan; irradiating, with a laser beam, the irradiation target region included in a second region column closest to the one region column on the one side of the one region column through the lens included in any one of the lens columns excluding the one lens column in second or later scan; and irradiating, with a laser beam, the irradiation target region included in a second region column closest to the one region column on an opposite side to the one side of the one region column through the lens included in any one of the lens columns excluding the one lens column in the second or later scan.

Advantageous Effects of Invention

According to the present invention, a seam between partial regions set in performing laser annealing can be made difficult to be visually recognized by a user.

DESCRIPTION OF EMBODIMENTS

Now, a laser annealing device and a laser annealing method according to embodiments of the present invention will be described in detail with reference to the accompanying drawings.

Figure 1:
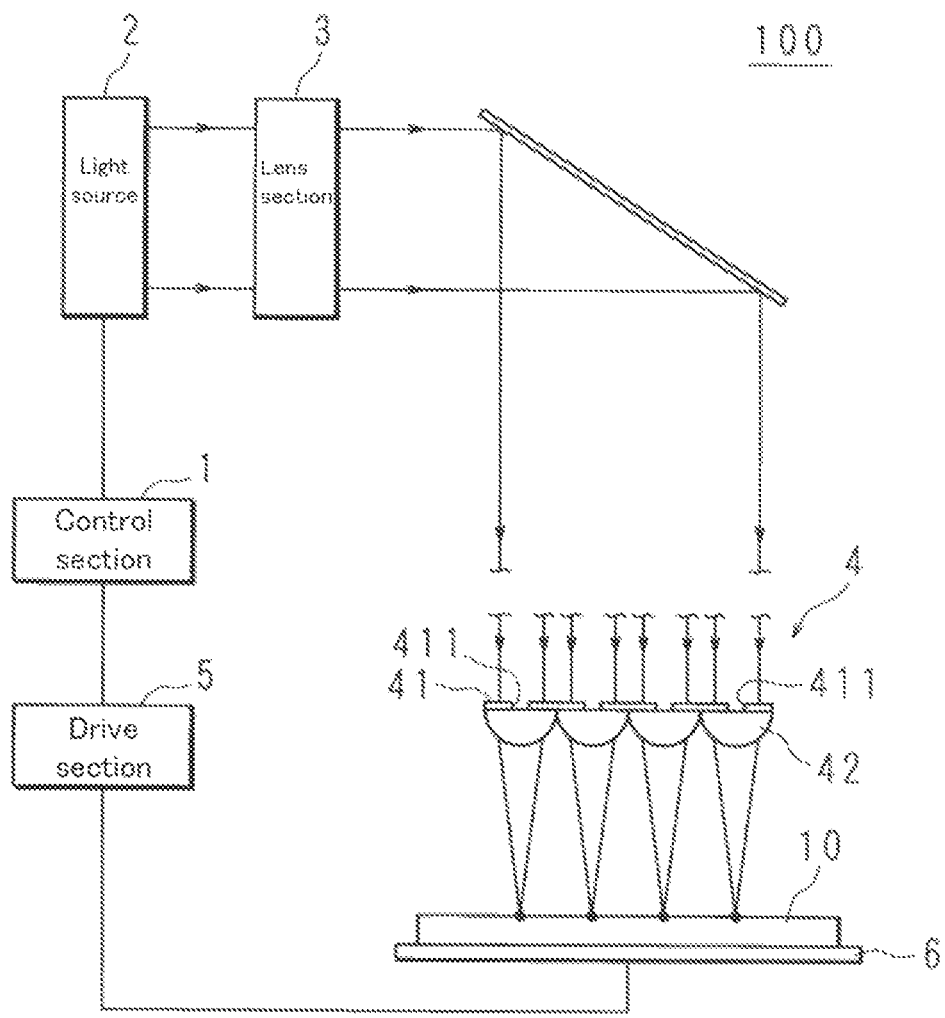
FIG. 1 is a diagram schematically illustrating a principal structure of a laser annealing device according to an embodiment of the present invention.

FIG. 1 is a diagram schematically illustrating a principal structure of a laser annealing device 100 according to the present embodiment.

The laser annealing device 100 includes a control section 1, a light source 2 (light emitting section) of a laser beam (hereinafter simply referred to as laser), a lens section 3, an irradiation section 4, a drive section 5 (moving mechanism), and a table section 6.

The light source 2 emits laser to be caused to enter a microlens array 42 described later. The laser emitted from the light source 2 is shaped into a parallel beam in the lens section 3. The laser thus shaped into a parallel beam is sent to the irradiation section 4. The laser emitted by the light source 2 is, for example, excimer laser that is laser of a prescribed wavelength radiated at a constant repetition period.

The irradiation section 4 receives the laser shaped into a parallel beam to irradiate a specific region on a glass substrate 10 that is a member to be irradiated. The irradiation section 4 includes a mask 41, and the microlens array (hereinafter simply referred to as the lens array) 42 in which a plurality of microlenses (hereinafter simply referred to as the lenses) are disposed in a matrix in a row direction and a column direction. In the mask 41, a plurality of through holes 411 are formed. The mask 41 allows a part of the laser to selectively pass through the through holes 411 with the other part shielded. The through holes 411 have, for example, a rectangular shape.

Figure 2:
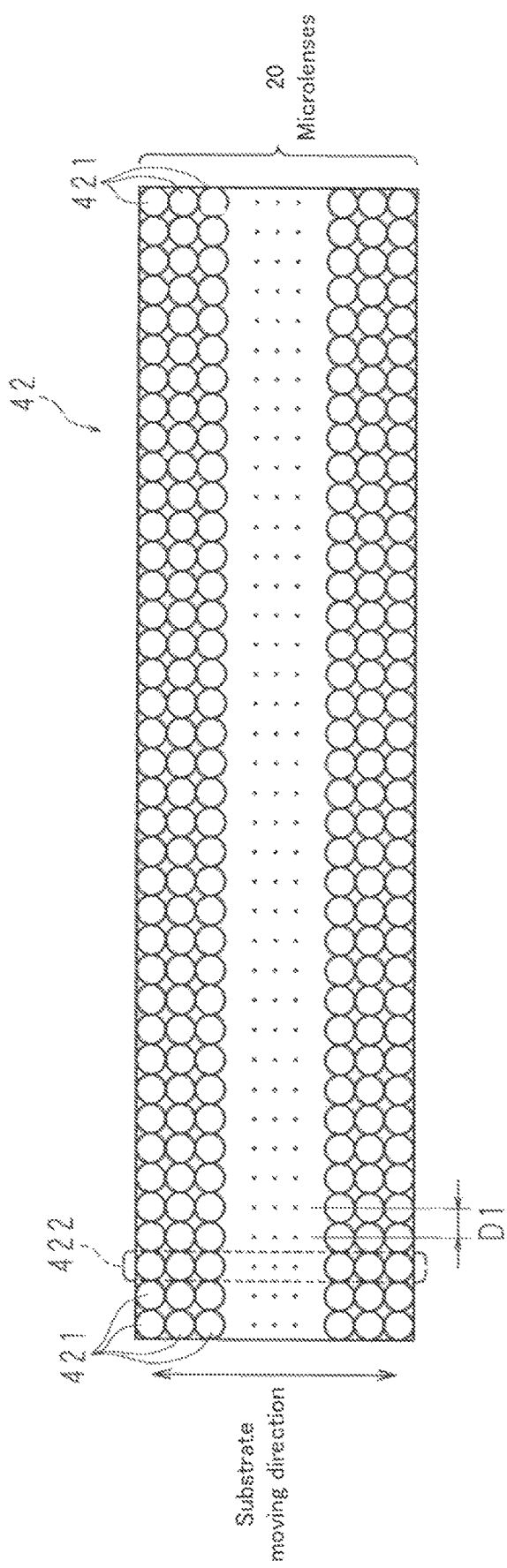
FIG. 2 is a diagram illustrating a microlens array of the laser annealing device of the embodiment.

FIG. 2 is a diagram illustrating the lens array 42 of the laser annealing device 100 according to the present embodiment.

Below the mask 41, the lens array 42 is disposed. The lens array 42 includes a plurality of lenses 421 provided side by side, and the lenses 421 are respectively disposed directly below the through holes 411 of the mask 41. Specifically, in the lens array 42, a plurality of microlens columns (hereinafter simply referred to as the lens columns) 422 each consisting of one or more lenses arranged in the column direction are disposed at a first interval D1 in the row direction. In the present embodiment, an interval (pitch) between the lenses 421 refers to a distance between the centers of the lenses 421, and an interval (pitch) between the lens columns 422 refers to a distance between the centers of the lenses 421 of the two lens columns 422. The first interval D1 is, for example, 400 μm.

The lens array 42 is in a rectangular shape having a larger length on one side in which the plural lenses 421 are disposed in a matrix. The length in the lengthwise direction (the row direction) of the lens array 42 is, for example, about 37 mm, and the length in the widthwise direction (the column direction) thereof is, for example, about 5 mm. In an example illustrated in FIG. 2, twenty lens columns 422 are disposed along the lengthwise direction of the lens array 42. Each lens 421 is in a semispherical shape, and has a radius of, for example, 200 μm. It is noted that the number of the lens columns 422 need not be always twenty, but may be larger than twenty or smaller than twenty.

The positions of the plural through holes 411 of the mask 41 and the positions of the plural lenses 421 of the lens array 42 respectively accord with each other. In other words, they are disposed in such a manner that the center of each lens 421 vertically matches the center of a corresponding one of the through holes 411. Thus, the laser having passed through the mask 41 is collected by the lenses 421 and passes different optical paths depending on the lenses 421, so as to partially irradiate a region requiring laser irradiation (hereinafter referred to as the irradiation target region) A (see FIG. 4) on the glass substrate 10 disposed at a prescribed distance from the lenses 421.

FIG. 1 will be referred to again. The drive section 5 relatively moves the irradiation section 4 and the glass substrate 10 in the column direction with the column direction along the lens columns 422 accorded with a direction along a region column 101 (see FIG. 4), so as to cause the irradiation section 4 to scan the glass substrate 10, namely, to move above the glass substrate 10. Here, the region column 101 refers to a column of irradiation target regions A disposed on the glass substrate 10. In the present embodiment, the drive section 5 moves, under control of the control section 1, the glass substrate 10 by moving the table section 6 having the glass substrate 10 thereon, and thus, changes a relative position of the glass substrate 10 against the irradiation section 4. The drive section 5 includes, for example, a drive motor or the like, and moves the table section 6 (the glass substrate 10) below the irradiation section 4 by driving the drive motor. It is noted that a structure in which the irradiation section 4 is moved with the table section 6 fixed, or a structure in which the table section 6 and the irradiation section 4 are moved may be employed in stead of the structure in which the table section 6 (the glass substrate 10) is moved.

The control section 1 controls the light source 2 and the drive section 5, and while causing the irradiation section 4 to scan the glass substrate 10, makes each irradiation target region A included in each of the region columns 101 disposed in a position corresponding to any one of the lens columns 422 (the region column 101 corresponding to any lens column 422) to be irradiated. Here, the position corresponding to the lens column 422 refers to a position on the glass substrate 10 that can be irradiated with laser through the lens 421 of the lens column 422 in the scan, and in the present embodiment, refers to a position on the substrate 10 passing below the lens column 422 in the scan. The laser irradiation of the irradiation target region A included in the region column 101 is performed through the lens 421 included in the lens column 422 corresponding to the region column 101.

The one or more irradiation target regions A included in the region column 101 are disposed at a prescribed interval along the column direction of the glass substrate 10. An interval between the adjacent two irradiation target regions A within the region column 101 is the same as the interval between the two adjacent lenses 421 within the lens column 422. While causing the irradiation section 4 to scan the glass substrate 10, the control section 1 causes the light source 2 to irradiate laser at a time interval when the lens 421 of the irradiation section 4 reaches above the irradiation target region A on the glass substrate 10. Accordingly, one irradiation target region A is irradiated with laser by the number of times according with the number of the lenses 421 included in the lens column 422.

Figure 3:
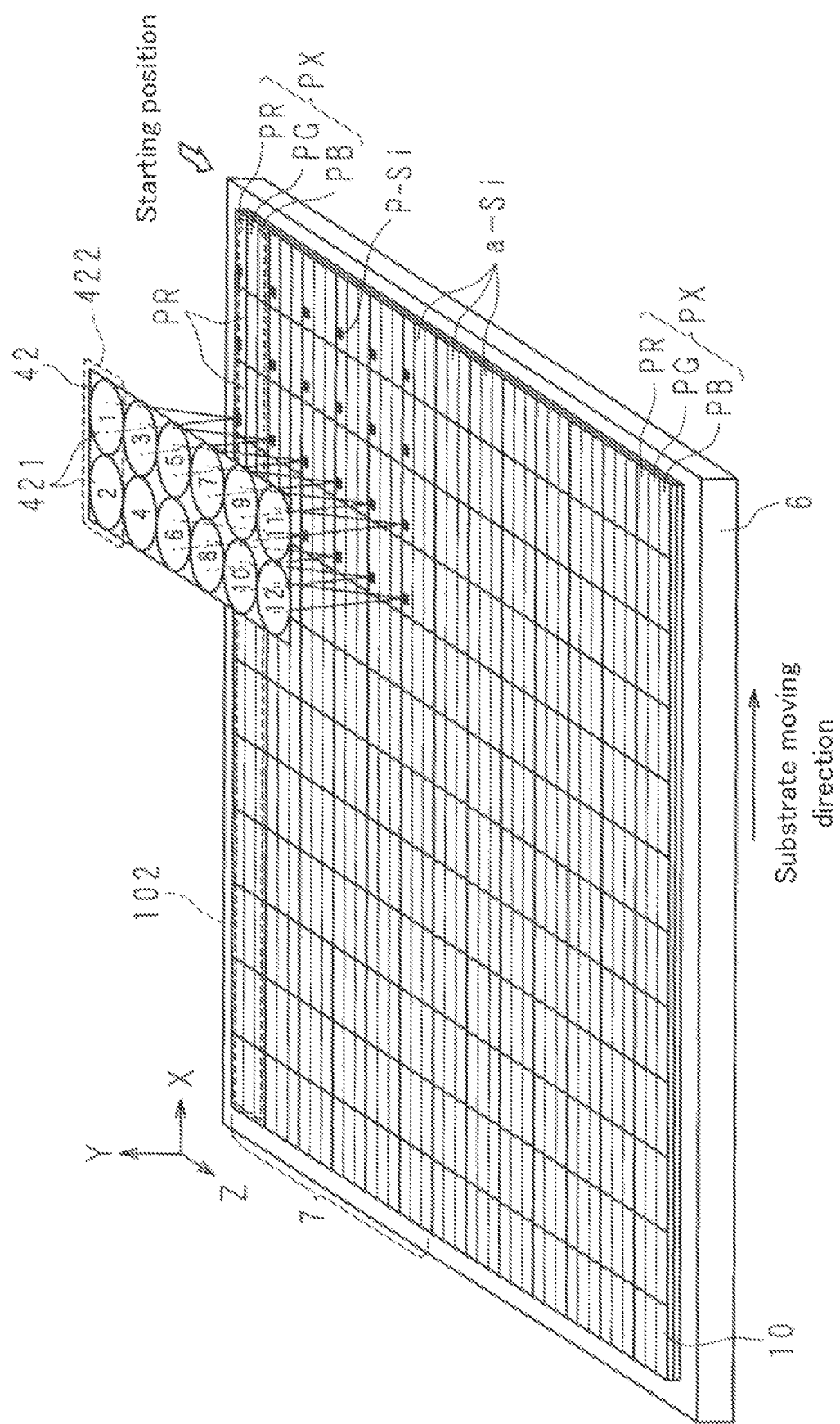
FIG. 3 is an explanatory diagram of partial laser irradiation performed by the laser annealing device of the embodiment.
Figure 4:
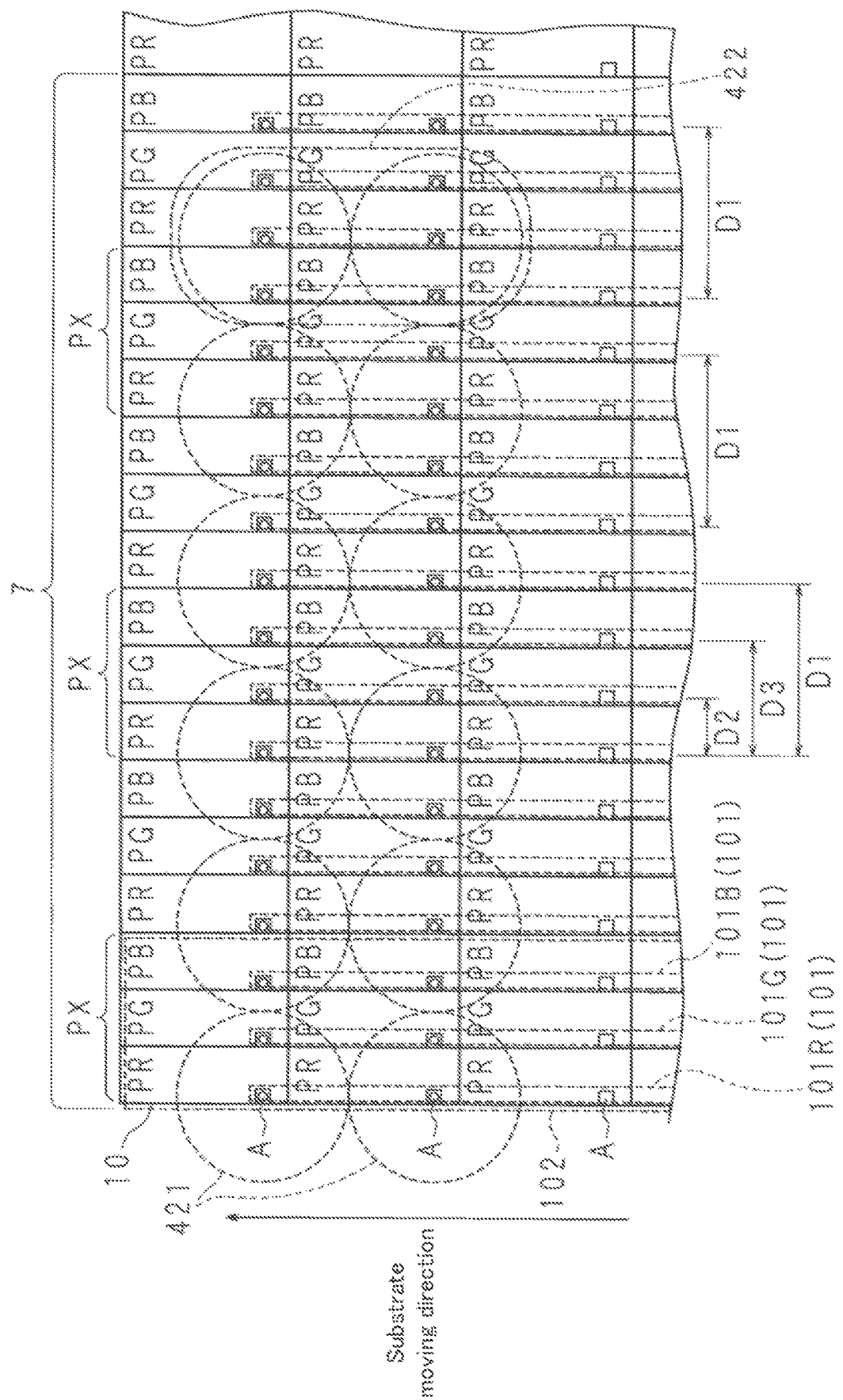
FIG. 4 is a diagram illustrating positional relationship between a microlens array and a glass substrate in the laser irradiation.

FIG. 3 is an explanatory diagram of partial laser irradiation performed by the laser annealing device 100 of the present embodiment. FIG. 4 is a diagram illustrating the positional relationship between the lens array 42 and the glass substrate 10 in the laser irradiation, and illustrates the positional relationship between the lens array 42 and the glass substrate 10 projected in a Y-direction of FIG. 3. In the following, the description will be made on the assumption, for simplification, that six lens columns 422 are disposed in the lengthwise direction of the lens array 42 and each lens column 422 includes two lenses 421, namely, that six lenses 421 are disposed in the row direction and two lenses 421 are disposed in the column direction of the lens array 42.

In the present embodiment, the glass substrate 10 is a TFT substrate used in production of a display panel. On the glass substrate 10, a plurality of pixel areas each defined by including a pixel electrode and a thin film transistor connected to the pixel electrode are disposed in a matrix in the row direction and in the column direction. The pixel areas include a plurality of types of pixel areas respectively corresponding to a plurality of colors, and in the present embodiment, include a pixel area PR corresponding to red color R (first color), a pixel area PG corresponding to green color G (second color), and a pixel area PB corresponding to blue color B (second color). The pixel area PR, the pixel area PG and the pixel area PB are aligned in the row direction of the glass substrate 10 in this order, and the continuous three pixel areas PR, PG and PB together construct a pixel unit PX. In other words, it can be said that a plurality of pixel units PX are disposed in a matrix in the row direction and in the column direction on the glass substrate 10. Hereinafter, a column of the pixel units PX aligned in the column direction of the glass substrate 10 will be referred to as the pixel unit column 102.

The laser annealing device 100 is used in a step of forming the thin film transistors of the pixel areas PR, PG and PB. Specifically, the laser annealing device 100 performs the laser irradiation in a specific region of each thin film transistor of the pixel areas PR, PG and PB, specifically, in a portion of an a-Si film formed on each gate electrode, so as to crystallize the portion of the a-Si film. The portion of the a-Si film corresponding to the irradiation target region A is, for example, a region between the source electrode and the drain electrode in the a-Si film, and a region directly below a part of the source electrode and a part of the drain electrode. In this manner, a p-Si region is selectively formed in the channel region of each thin film transistor of the pixel areas PR, PG and PB.

As described above, a plurality of pixel areas PR, PG and PB are disposed in a matrix in the row direction and the column direction on the glass substrate 10, and the specific region of each thin film transistor of the pixel areas PR, PG and PB corresponds to the irradiation target region A. In other words, it can be said that a plurality of irradiation target regions A are disposed on the glass substrate 10 in a matrix in the row direction and the column direction. A column of one or more irradiation target regions A aligned in the column direction of the glass substrate 10 corresponds to the region column 101.

In the present embodiment, the glass substrate 10 includes three types of region columns 101. Specifically, the glass substrate 10 includes a region column 101R (first region column) that is a column of specific regions of the thin film transistors of the pixel areas PR, a region column 101G (second region column) that is a column of specific regions of the thin film transistors of the pixel areas PG, and a region column 101B (third region column) that is a column of specific regions of the thin film transistors of the pixel area PB.

On the glass substrate 10, each of the three types of the region columns 101R, 101G and 101B is disposed in a plural number at the first interval D1 in the row direction. In other words, the interval of each of the region columns 101R, 101G and 101B (the interval between the same type of region columns 101) is the same as the interval between the lens columns 422. Accordingly, the laser annealing device 100 can perform the laser irradiation simultaneously on a plurality of the same type region columns 101 in a single scanning operation. In the present embodiment, the interval (pitch) between the irradiation target regions A refers to a distance between the centers of the irradiation target regions A, and the interval (pitch) between the region columns 101 refers to a distance between the centers of the target regions A of the two region columns 101.

On the other hand, an interval between the different types of region columns 101 is smaller than the interval between the lens columns 422. Specifically, the region column 101G is disposed to be spaced from the region column 101R at a second interval D2, which is smaller than the first interval D1, on one side in a perpendicular direction to the region column 101R (rightward in the row direction in the present embodiment). Besides, the region column 101B is disposed to be spaced from the region column 101R at a third interval D3, which is smaller than the first interval D1, on one side in the perpendicular direction to the region column 101R (rightward in the row direction in the present embodiment). In the present embodiment, the second interval D2 is ½ of the third interval D3, and is ⅓ of the first interval D1. In other words, the region column 101G and the region column 101B are disposed at equal intervals between two adjacent region columns 101R.

In this manner, the interval between the different types of region columns 101 is smaller than the interval between the lens columns 422, and therefore, the leaser annealing device 100 cannot perform the laser irradiation simultaneously on a plurality of different types of region columns 101. Besides, since the length in the row direction of the irradiation section 4 (the lens array 42) is smaller than the length in the row direction of the substrate 10 as illustrated in FIG. 3, the laser annealing device 100 cannot scan the whole substrate 10 in one go. Therefore, for performing the laser irradiation on all the irradiation target regions A on the substrate 10, the laser annealing device 100 repeats the scan and the laser irradiation on the substrate 10 several times. Hereinafter, a region corresponding to a region on the substrate 10 to be simultaneously scanned in a single scanning operation and defined by some of pixel unit columns 102 will be referred to as a partial region 7. In other words, the partial region 7 is a region defined by a plurality of pixel unit columns 102 corresponding to a plurality of region columns 101 that can be simultaneously subjected to the laser irradiation in a single scanning operation. Here, the pixel unit column 102 corresponding to the region column 101 refers to a pixel unit column 102 including the region column 101.

For performing the laser irradiation on all the irradiation target regions A on the glass substrate 10, the laser annealing device 100 can employ, for example, the following method: The laser annealing device 100 divides a region including all the pixel unit columns 102 on the glass substrate 10 into a plurality of partial regions 7, and first scans a first partial region 7 repeatedly three times, so as to perform the laser irradiation respectively on the three types of region columns 101R, 101G and 101B included in the first partial region 7. Next, a second partial region 7 is repeatedly scanned three times so as to perform the laser irradiation respectively on the three types of region columns 101R, 101G and 101B included in the second partial region 7. Such a process is repeatedly performed on all the partial regions 7, and thus, the laser annealing device 100 can perform the laser irradiation on all the irradiation target regions A on the glass substrate 10. In other words, in employing this method, the laser irradiation is performed respectively on the three types of region columns 101R, 101G and 101B included in one pixel unit column 102 through the same lens column 422 (through the lenses 421 included in the same lens column 422).

When this method is employed, however, the following problem arises: In a single scanning operation, the positional relationship in the row direction between the lens column 422 and the region column 101 corresponding to this lens column 422 is not largely changed during the scan, and therefore, a distance between the lens 421 and the irradiation target region A is kept substantially constant in the laser irradiation. Accordingly, a large difference is not caused in the degree of crystallization among a plurality of irradiation target regions A to be subjected to the laser irradiation in a single scanning operation, and display characteristics of a plurality of pixel areas subjected to the laser irradiation in a single scanning operation (the pixel areas including the irradiation target regions A subjected to the laser irradiation) are substantially uniform. In other words, the display characteristics of the pixel areas of the same type included in the partial region 7 are substantially uniform. Besides, one partial region 7 is repeatedly scanned three times, and the display characteristics of the respective types of the pixel areas PR, PG and PB included in the partial region 7 are substantially uniform, and hence, the display characteristics of the pixel units PX obtained by synthesizing these types of pixel areas PR, PG and PB are substantially uniform in the partial region 7.

On the other hand, after scanning one partial region 7 three times, the partial region 7 to be scanned is changed, and at this point, the relative position of the irradiation section 4 against the glass substrate 10 is moved in the row direction to a position corresponding to the partial region 7 to be scanned next. Therefore, owing to influence of this movement, a difference is caused, between the previous scan and the next scan, in the positional relationship in the row direction between the lens column 422 and the region column 101 corresponding to this lens column 422, and a difference is caused in a distance between the lens 421 and the irradiation target region A in the laser irradiation. Accordingly, a difference is caused in the degree of crystallization of the irradiation target regions A within the pixel areas of the same type between the partial region 7 scanned previously and the partial region 7 scanned next, and a difference is caused in display characteristics of the pixel areas of the same type. Accordingly, a difference is caused between the display characteristics of the pixel unit PX included in the partial region 7 scanned previously and the display characteristics of the pixel unit PX included in the partial region 7 scanned next. As a result, a seam between one partial region 7 and another adjacent partial region 7 is conspicuous, and there arises a problem that the seam is easily visually recognized by a user.

For coping with such a problem, the laser annealing device 100 of the present embodiment does not scan one partial region 7 three times, but the partial region 7 to be scanned is shifted in at least one scanning operation among the three scanning operations (for the laser irradiation of the different types of region columns 101), and thus, a seam between the partial regions 7 is made difficult to be visually recognized by a user. In other words, in the laser annealing device 100 of the present embodiment, the laser irradiation is performed on at least one type of region column 101 included in one pixel unit column 102 through a lens column 422 different from those used for the other type of region columns 101. Now, laser irradiation performed by the laser annealing device 100 of the present embodiment will be described in detail with reference to FIGS. 5 to 9.

Figure 5:
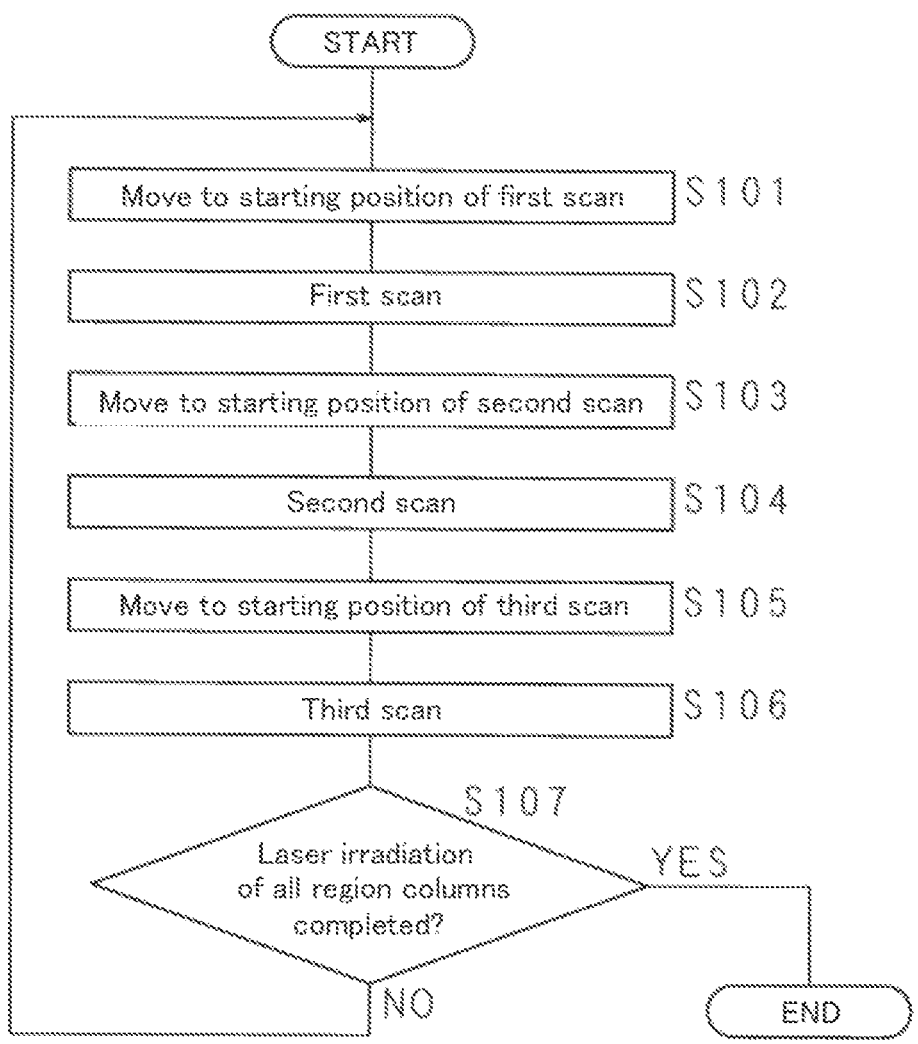
FIG. 5 is a flowchart illustrating procedures in the partial laser irradiation performed by the laser annealing device of the embodiment.

FIG. 5 is a flowchart illustrating procedures in partial laser irradiation performed by the laser annealing device 100 of the present embodiment. FIGS. 6 to 9 are respectively first to fourth diagrams illustrating procedures in the partial laser irradiation performed by the laser annealing device 100 of the present embodiment. In the following, the description will be made on the assumption that the scan and the laser irradiation are repeatedly performed from the left side to the right side of the glass substrate 10. In the description made referring to FIGS. 5 to 9, a pixel unit column 102 disposed on an nth position (n is an integer equal to or larger than 1) from the left of the glass substrate 10 is referred to as a pixel unit column COLn. Besides, a lens column 422 disposed on an nth position from the left of the lens array 42 is referred to as a lens column Ln.

Figure 6:
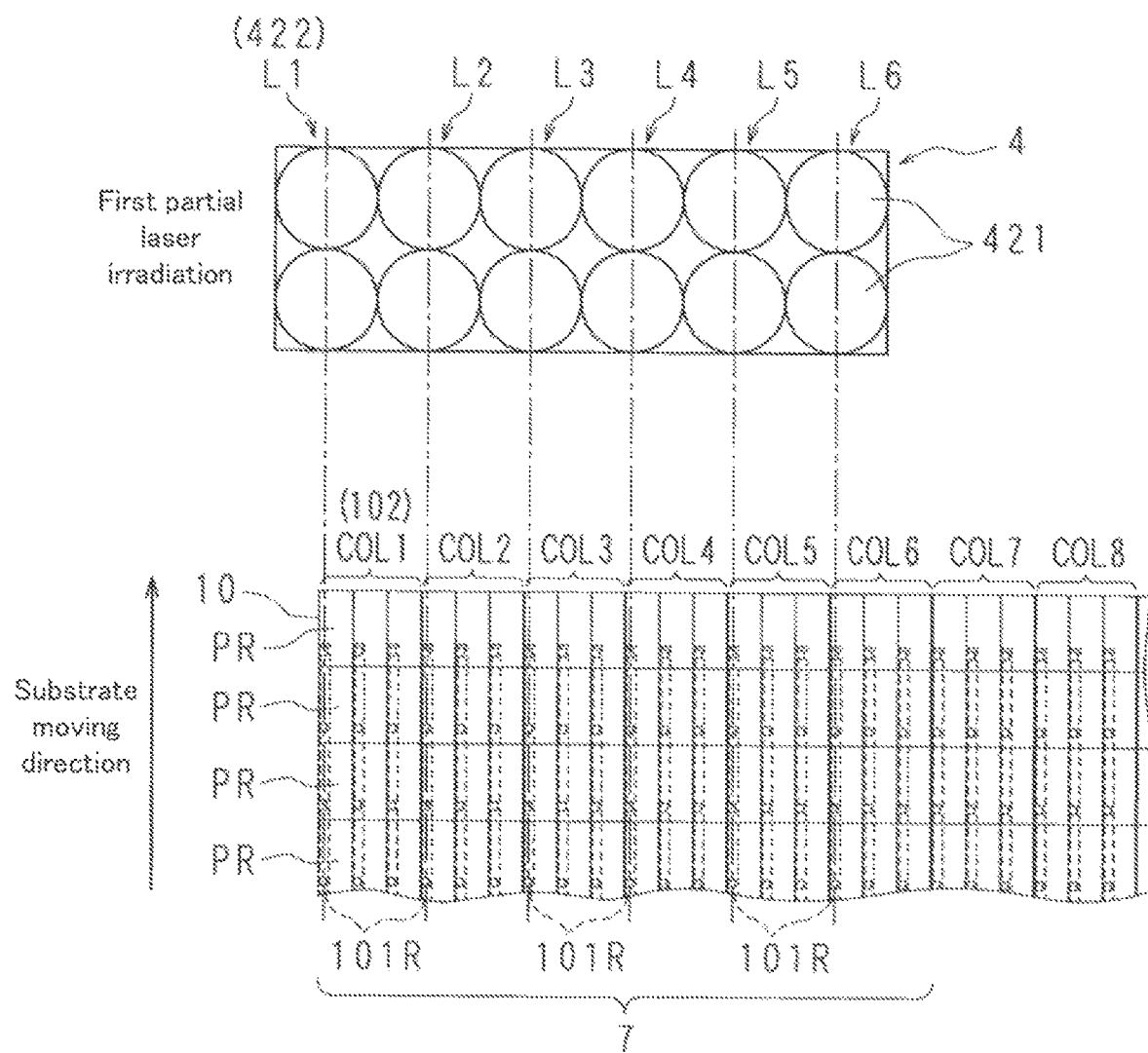
FIG. 6 is a first diagram illustrating procedures in the partial laser irradiation performed by the laser annealing device of the embodiment.

First, the control section 1 of the laser annealing device 100 sets, as the partial region 7 to be scanned, a region defined by pixel unit columns COL1 to COL6 (hereinafter referred to as the partial region COL1-6) as illustrated in FIG. 6, and sets the region columns 101R included in the partial region COL1-6 as the region columns 101 to be subjected to the laser irradiation. Then, the control section 1 moves the glass substrate 10 to a starting position of scan (first scan) for performing the laser irradiation on the region columns 101R included in the partial region COL1-6 (Step S101). Here, the starting position of the first scan is a position in which the respective region columns 101R included in the partial region COL1-6 correspond to any lens columns 422 in the row direction and the glass substrate 10 and the irradiation section 4 do not overlap each other in a direction perpendicular to the plate surface of the glass substrate 10 (the vertical direction).

Thereafter, the control section 1 performs the first scan (Step S102). Specifically, the control section 1 makes respective irradiation target regions A included in the region columns 101R included in the partial region COL1-6 while moving the glass substrate 10 in the column direction for scanning the partial region COL1-6 to be irradiated with laser by the irradiation section 4. Through the first scan, the irradiation target regions A within the respective pixel areas PR included in the partial region COL1-6 are irradiated with laser.

As illustrated in FIG. 6, in the first scan, the region column 101R of the pixel unit column COL1 is subjected to the laser irradiation through the lens column L1. The region column 101R of the pixel unit column COL2 is subjected to the laser irradiation through the lens column L2. The region column 101R of the pixel unit column COL3 is subjected to the laser irradiation through the lens column L3. The region column 101R of the pixel unit column COL4 is subjected to the laser irradiation through the lens column LA. The region column 101R of the pixel unit column COL5 is subjected to the laser irradiation through the lens column L5. The region column 101R of the pixel unit column COL6 is subjected to the laser irradiation through the lens column L6.

Figure 7:
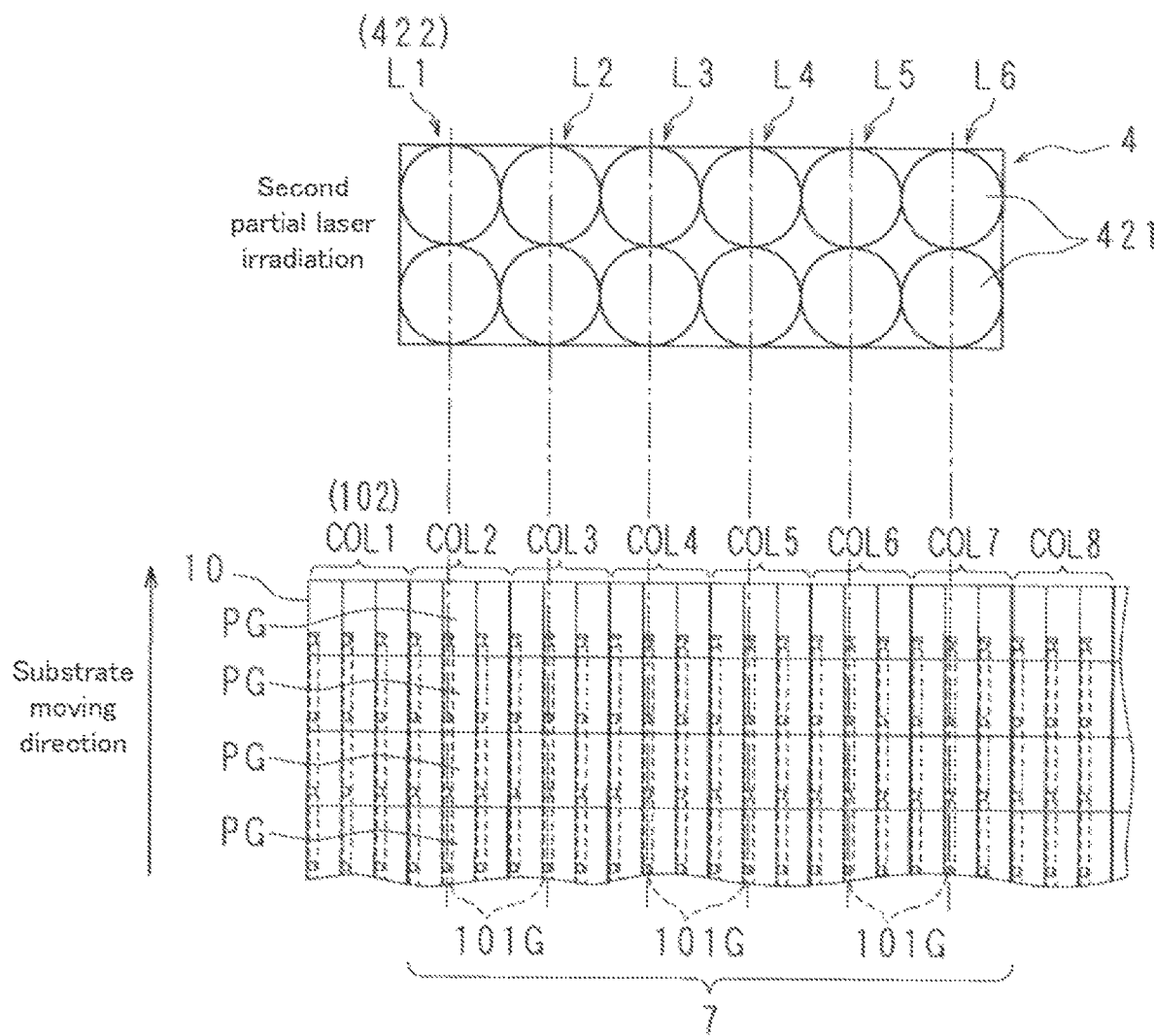
FIG. 7 is a second diagram illustrating the procedures in the partial laser irradiation performed by the laser annealing device of the embodiment.

Next, the control section 1 sets, as the partial region 7 to be scanned, a region defined by pixel unit columns COL2 to COL7 (hereinafter referred to as the partial region COL2-7) as illustrated in FIG. 7, and sets the region columns 101G included in the partial region COL2-7 as the region columns 101 to be subjected to the laser irradiation. Then, the control section 1 moves the glass substrate 10 to a starting position of scan (second scan) for performing the laser irradiation on the region columns 101G included in the partial region COL2-7 (Step S103). Here, the starting position of the second scan is a position in which the respective region columns 101G included in the partial region COL2-7 correspond to any lens columns 422 in the row direction and the glass substrate 10 and the irradiation section 4 do not overlap each other in the direction perpendicular to the plate surface of the glass substrate 10 (the vertical direction).

Thereafter, the control section 1 performs the second scan (Step S104). Specifically, the control section 1 makes respective irradiation target regions A included in the region columns 101G included in the partial region COL2-7 while moving the glass substrate 10 in the column direction for scanning the partial region COL2-7 to be irradiated with laser by the irradiation section 4. Through the second scan, the irradiation target regions A within the respective pixel areas PG included in the partial region COL2-7 are irradiated with laser.

As illustrated in FIG. 7, in the second scan, the region column 101G of the pixel unit column COL2 is subjected to the laser irradiation through the lens column L1. The region column 101G of the pixel unit column COL3 is subjected to the laser irradiation through the lens column L2. The region column 101G of the pixel unit column COL4 is subjected to the laser irradiation through the lens column L3. The region column 101G of the pixel unit column COL5 is subjected to the laser irradiation through the lens column L4. The region column 101G of the pixel unit column COL6 is subjected to the laser irradiation through the lens column L5. The region column 101G of the pixel unit column COL7 is subjected to the laser irradiation through the lens column L6.

In this manner, in the present embodiment, the partial region 7 to be scanned is changed between the laser irradiation of the first region column (the region column 101R) and the laser irradiation of the second region column (the region column 101G). In other words, a first region column and a second region column included in one pixel unit column 102 are subjected to the laser irradiation through different lens columns 422. Thus, a position of a seam in respect to the pixel area PR corresponding to the first color (red color R) (a seam in regard to the pixel area PR) and a position of a seam in respect to the pixel area PG corresponding to the second color (green color G) (a seam in regard to the pixel area PG) can be shifted from each other, and therefore, as compared with the conventional technique in which the position of the seam in regard to the pixel area PR and the position of the seam in regard to the pixel area PG are the same, the seam between the partial regions 7 can be made difficult to be visually recognized by a user.

Figure 8:
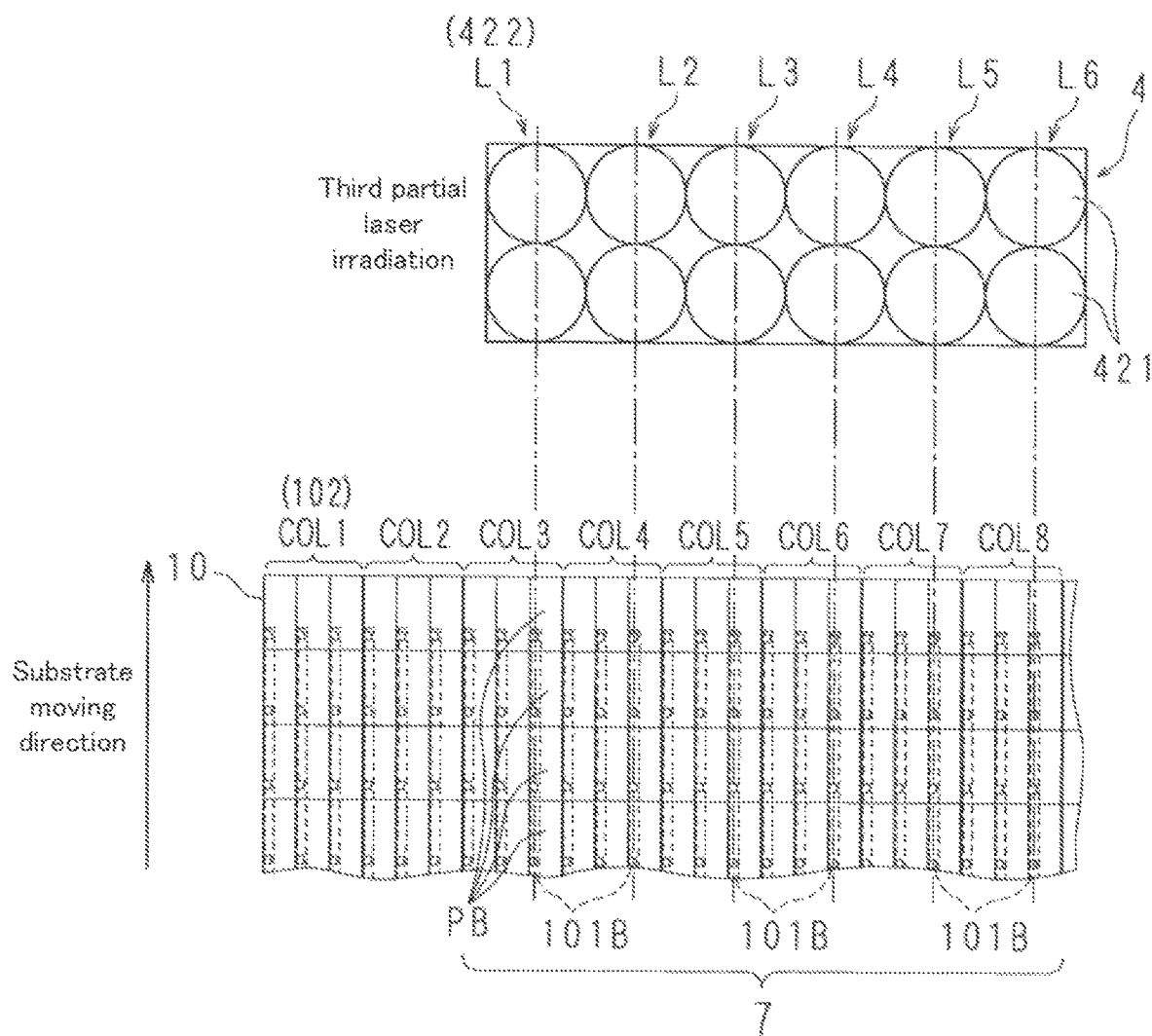
FIG. 8 is a third diagram illustrating the procedures in the partial laser irradiation performed by the laser annealing device of the embodiment.

Next, the control section 1 sets, as the partial region 7 to be scanned, a region defined by pixel unit columns COL3 to COL8 (hereinafter referred to as the partial region COL3-8) as illustrated in FIG. 8, and sets the region columns 101B included in the partial region COL3-8 as the region columns 101 to be subjected to the laser irradiation. Then, the control section 1 moves the glass substrate 10 to a starting position of scan (third scan) for performing the laser irradiation on the region columns 101B included in the partial region COL3-8 (Step S105). Here, the starting position of the third scan is a position in which the respective region columns 101B included in the partial region COL3-8 correspond to any lens columns 422 in the row direction and the glass substrate 10 and the irradiation section 4 do not overlap each other in the direction perpendicular to the plate surface of the glass substrate 10 (the vertical direction).

Thereafter, the control section 1 performs the third scan (Step S106). Specifically, the control section 1 makes respective irradiation target regions A included in the region columns 101B included in the partial region COL3-8 while moving the glass substrate 10 in the column direction for scanning the partial region COL3-8 to be irradiated with laser by the irradiation section 4. Through the third scan, the irradiation target regions A within the respective pixel areas PB included in the partial region COL3-8 are irradiated with laser.

As illustrated in FIG. 8, in the third scan, the region column 101B of the pixel unit column COL3 is subjected to the laser irradiation through the lens column L1. The region column 101B of the pixel unit column COL4 is subjected to the laser irradiation through the lens column L2. The region column 101B of the pixel unit column COL5 is subjected to the laser irradiation through the lens column L3. The region column 101B of the pixel unit column COL6 is subjected to the laser irradiation through the lens column L4. The region column 101B of the pixel unit column COL7 is subjected to the laser irradiation through the lens column L5. The region column 101B of the pixel unit column COL8 is subjected to the laser irradiation through the lens column L6.

In this manner, in the present embodiment, the partial region 7 to be scanned is changed also in the laser irradiation of the third region column (the region column 101B). In other words, the first region column (region column 101R), the second region column (region column 101G) and the third region column (region column 101B) included in one pixel unit column 102 are subjected to the laser irradiation through different lens columns 422. Thus, a position of a seam between the partial regions 7 in respect to the pixel area PB corresponding to the third color (blue color B) (a seam in regard to the pixel area PB) can be also shifted from the position of the seam in respect to the pixel area PR and the position of the seam in respect to the pixel area PG, and therefore, the seam between the partial regions 7 can be more effectively made difficult to be visually recognized by a user.

Thereafter, the control section 1 determines whether or not the laser irradiation has been performed on all the region columns 101 (the irradiation target regions A) disposed on the glass substrate 10 (Step S107). For example, the control section 1 precedently stores information corresponding to all the region columns 101 disposed on the glass substrate 10, and stores information corresponding to which region column 101 has been subjected to the laser irradiation every time the scan and the laser irradiation are performed, so that the determination can be made in Step S107 based on the information thus stored.

When it is determined that the laser irradiation has been performed on all the region columns 101 disposed on the glass substrate 10 (Step S107: YES), the control section 1 completes the processing illustrated in the flowchart of FIG. 5.

On the other hand, when it is determined that the laser irradiation has not been performed yet on all the region columns 101 disposed on the glass substrate 10 (Step S107: NO), the control section 1 sets, as the partial region 7 to be scanned, a partial region 7 including one or more image unit columns 102 corresponding to one or more region columns 101 not scanned yet (namely, not subjected to the laser irradiation), and performs procedures similar to those of Step S101 to Step S106.

At a stage when the third scan is completed, with respect to the region columns 101R, the region columns 101R included in the pixel unit columns 102 disposed on the right side of the pixel unit column COL7 have not been scanned yet. Besides, with respect to the region columns 101G, the region columns 101G of the pixel unit columns 102 disposed on the right side of the pixel unit column COL8 and of the pixel unit column COL1 have not been scanned yet. Besides, with respect to the region columns 101B, the region columns 101G of the pixel unit columns 102 disposed on the right side of the pixel unit column COL9, and of the pixel unit columns COL1 and the pixel unit column COL2 have not been scanned yet.

Figure 9:
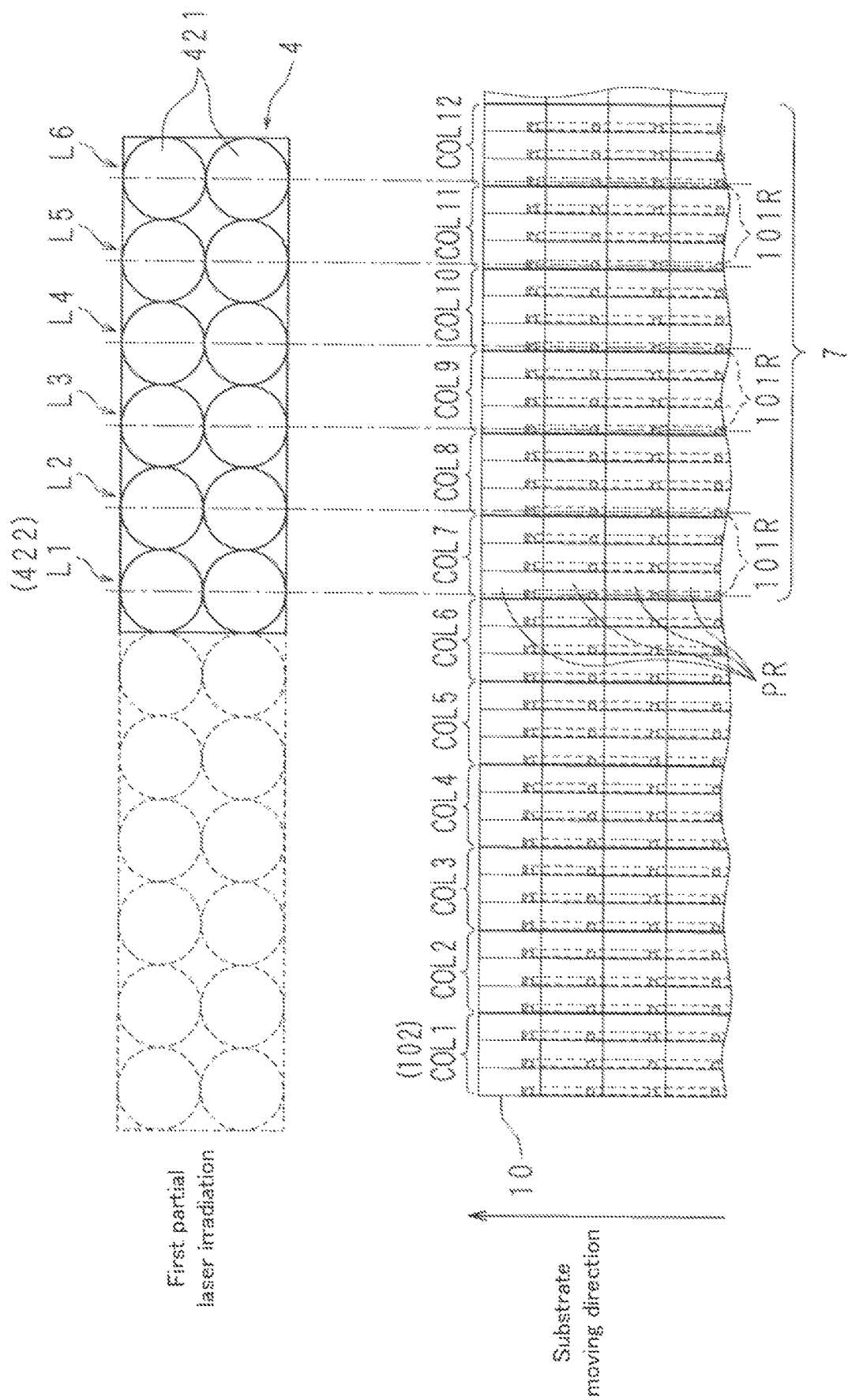
FIG. 9 is a fourth diagram illustrating the procedures in the partial laser irradiation performed by the laser annealing device of the embodiment.

Accordingly, the control section 1 sets, as the partial region 7 to be scanned, a region defined by pixel unit columns COL7 to COL12 (hereinafter referred to as the partial region COL7-12) as illustrated in FIG. 9, and sets the region columns 101R included in the partial region COL7-12 as the region columns 101 to be subjected to the laser irradiation. Then, the control section 1 moves the glass substrate 10 to a starting position of scan (fourth scan) for performing the laser irradiation on the region columns 101R included in the partial region COL7-12 (in the same manner as in Step S101). Here, the starting position of the fourth scan is a position in which the respective region columns 101R included in the partial region COL7-12 correspond to any lens columns 422 in the row direction and the glass substrate 10 and the irradiation section 4 do not overlap each other in the direction perpendicular to the plate surface of the glass substrate 10 (the vertical direction).

Thereafter, the control section 1 performs the fourth scan (in the same manner as in Step S102). Specifically, the control section 1 makes respective irradiation target regions A included in the region columns 101R included in the partial region COL7-12 while moving the glass substrate 10 in the column direction for scanning the partial region COL7-12 to be irradiated with laser by the irradiation section 4. Through the fourth scan, the irradiation target regions A within the respective pixel areas PR included in the partial region COL7-12 are irradiated with laser.

As illustrated in FIG. 9, in the fourth scan, the region column 101R of the pixel unit column COL7 is subjected to the laser irradiation through the lens column L1. The region column 101R of the pixel unit column COL8 is subjected to the laser irradiation through the lens column L2. The region column 101R of the pixel unit column COL9 is subjected to the laser irradiation through the lens column L3. The region column 101R of the pixel unit column COL10 is subjected to the laser irradiation through the lens column L4. The region column 101R of the pixel unit column COL11 is subjected to the laser irradiation through the lens column L5. The region column 101R of the pixel unit column COL12 is subjected to the laser irradiation through the lens column L6.

Here, among the region columns 101 to be subjected to the laser irradiation and included in the partial region 7 to be scanned, a region column 101 disposed at the right or left end will be referred to as a scan-end region column 101, and a region column 101 not disposed at the right or left end will be referred to as a non-scan-end region column 101. In particular, a region column 101 disposed at the right end will be referred to as a first scan-end region column 101, and a region column 101 disposed at the left end will be referred to as a second scan-end region column 101. In the first scan, the first scan-end region column 101 is the region column 101R of the pixel unit column COL6, and is subjected to the laser irradiation through the lenses 421 included in the lens column L6 disposed at the right end (first end) of the lens array 42. On the other hand, in the fourth scan, the second scan-end region column 101 is the region column 101R of the pixel unit column COL7, and is subjected to the laser irradiation through the lenses 421 included in the lens column L disposed at the left end (second end) of the lens array 42. Here, the second scan-end region column 101 of the fourth scan is a region column 101 that is the closest to the first scan-end region column 101 of the first scan and has not been scanned yet.

It is noted that the scan for subjecting the region columns 101R included in the partial region COL7-12 to the laser irradiation need not be the fourth scan but may be the second, the third, the fifth or later scan. Also in this case, the above-described relationship about the scan ends holds between the scan performed for the laser irradiation of the region columns 101R included in the partial region COL7-12 and the first scan.

Besides, it is understood, in respect to the non-scan-end region columns 101R of the first scan, namely, the region columns 101R of the pixel unit columns COL2 to COL5, that a region column 101G closest to the region column 101R on the right side of the region column 101R and a region column 101G closest to the region column 101R on the left side of the region column 101R are both subjected to the laser irradiation through the lenses 421 included in the lens columns 422 different from the lens column 422 used for the laser irradiation of the region column 101R. For example, a region column 101G closest to the region column 101R of the pixel unit column COL3 on the right side of the region column 101R is the region column 101G of the pixel unit column COL3. The region column 101G of the pixel unit column COL3 is subjected to the laser irradiation through the lenses 421 included in the lens column L2, which is different from the lens column L3 used in the laser irradiation of the region column 101R of the pixel unit column COL3 (see FIG. 6 and FIG. 7). Besides, a region column 101G closest to the region column 101R of the pixel unit column COL3 on the left side of the region column 101R is the region column 101G of the pixel unit column COL2. The region column 101G of the pixel unit column COL2 is subjected to the laser irradiation through the lenses 421 included in the lens column L1, which is different from the lens column L3 used in the laser irradiation of the region column 101R of the pixel unit column COL3 (see FIG. 6 and FIG. 7).

Incidentally, two region columns 101G closest to a non-scan-end region column 101R respectively on the right side and the left side of the region column 101R may be subjected to the laser irradiation by the same scanning operation or a different scanning operation. For example, the region column 101R of the pixel unit column COL3 is subjected to the laser irradiation by the same scanning operation (the second scan) as the region column 101G closest to the region column 101R on the right side of the region column 101R (the region column 101G of the pixel unit column COL3) and the region column 101G closest to the region column 101R on the left side of the region column 101R (the region column 101G of the pixel unit column COL2) (see FIG. 7). On the other hand, the region column 101R of the pixel unit column COL2 is subjected to the laser irradiation by a different scanning operation from the region column 101G closest to the region column 101R on the right side of the region column 101R (the region column 101G of the pixel unit column COL2) and the region column 101G closest to the region column 101R on the left side of the region column 101R (the region column 101G of the pixel unit column COL1).

Next, the control section 1 sets, as the partial region 7 to be scanned, a region defined by pixel unit columns COL8 to COL13 (hereinafter referred to as the partial region COL8-13), and sets the region columns 101G included in the partial region COL8-13 as the region columns 101 to be subjected to the laser irradiation. Then, the control section 1 moves the glass substrate 10 to a starting position of scan (fifth scan) for performing the laser irradiation on the region columns 101G included in the partial region COL8-13, and performs the fifth scan. These procedures are the same as those of Steps S103 and S104. Through the fifth scan, the irradiation target regions A within the pixel areas PG included in the partial region COL8-13 are irradiated with laser.

Next, the control section 1 sets, as the partial region 7 to be scanned, a region defined by pixel unit columns COL9 to COL14 (hereinafter referred to as the partial region COL9-14), and sets the region columns 101B included in the partial region COL9-14 as the region columns 101 to be subjected to the laser irradiation. Then, the control section 1 moves the glass substrate 10 to a starting position of scan (sixth scan) for performing the laser irradiation on the region columns 101B included in the partial region COL9-14, and performs the sixth scan. These procedures are the same as those of Step S105 and S106. Through the sixth scan, the irradiation target regions A within the pixel areas PB included in the partial region COL9-14 are irradiated with laser.

The control section 1 repeatedly performs procedures similar to those of Steps S101 to S106 until the laser irradiation of all the region columns 101 disposed on the glass substrate 10 is completed.

Incidentally, the order of performing the scan and the laser irradiation is not limited to the above-described order. For example, the laser annealing device 100 may perform the laser irradiation first on all the region columns 101R, perform the laser irradiation next on all the region columns 101G, and perform the laser irradiation last on all the region columns 101B. In this case, for example, the region columns 101R included in the partial region COL7-12 are subjected to the laser irradiation in the second scan, and the region columns 101R included in the partial region COL13-18 are subjected to the laser irradiation in the third scan.

Besides, the laser annealing device 100 may perform the laser irradiation not in the order of the region columns 101R, the region columns 101G and the region column 101B but in a different order from this order, for example, in an order of the region columns 101B, the region columns 101G and the region columns 101R. In this case, for example, the region columns 101B included in the partial region COL1-6 are subjected to the laser irradiation in the first scan, the region columns 101G included in the partial region COL2-7 are subjected to the laser irradiation in the second scan, and the region columns 101R included in the partial region COL3-8 are subjected to the laser irradiation in the third scan.

Besides, the laser annealing device 100 repeats the scan and the laser irradiation from the left side to the right side of the glass substrate 10 in the present embodiment, which does not limit the present invention, but it may repeat the scan and the laser irradiation from the right side to the left side of the glass substrate 10, or may start the scan and the laser irradiation from a center part of the glass substrate 10.

As described so far, the laser annealing device 100 according to the present embodiment changes the partial regions 7 to be scanned among the laser irradiation of the first region columns (the region columns 101R), the laser irradiation of the second region columns (the region columns 101G), and the laser irradiation of the third region columns (the region columns 101B). In other words, the first region column (the region column 101R), the second region column (the region column 101G) and the third region column (the region column 101B) included in one pixel unit column 102 are subjected to the laser irradiation respectively through the different lens columns 422. Thus, the position of the seam in respect to the pixel area PR, the position of the seam in respect to the pixel area PG and the position of the seam in respect to the pixel area PB can be shifted from one another, and therefore, as compared with the conventional technique in which these three seams are in the same position, the seam between the partial regions 7 can be made difficult to be visually recognized by a user.

In the above-described embodiment, the description is made on the assumption that one pixel unit PX consists of the three pixel areas of the pixel areas PR, PG and PB, which does not limit the present embodiment, but one pixel unit PX may consist of two, four or more pixel areas.

The laser annealing device 100 according to the present embodiment is a laser annealing device 100 including an irradiation section 4 in which a plurality of lens columns 422 each consisting of at least one lens 421 are disposed at a first interval D1, for irradiating an irradiation target region A with a laser beam through the lens 421 while scanning a substrate 10 by the irradiation section 4, the substrate 10 including region columns 101 each consisting of at least one irradiation target region A, the region columns 101 including a plurality of first region columns 101R disposed at the first interval D1, and a plurality of second region columns 101G disposed to be spaced from the first region columns 101R at a second interval D2 smaller than the first interval D1 toward one side in a perpendicular direction to the region columns 101, and the laser annealing device includes; a light emitting section 2 emitting a laser beam to be caused to enter the lens 421; a moving mechanism 5 relatively moving the irradiation section 4 and the substrate 10 in a column direction along the lens columns 422 with the column direction accorded with the direction along the region columns 101; and a control section 1 controlling the light emitting section 2 and the moving mechanism 5 to irradiate, with a laser beam, the irradiation target region A included in each of the region columns 101 disposed in positions corresponding to any one of the lens columns 422 through a lens 421 included in a lens column 422 corresponding to the region column 101 while causing the irradiation section 4 to scan the substrate 10 in the column direction, and the control section 1 controls the light emitting section 2 and the moving mechanism 5 to irradiate, with a laser beam, the irradiation target region A included in one non-scan-end region column 101R among the plurality of first region columns 101R through the lens 421 included in one lens column 422 among the plurality of lens columns 422 in first scan, controls the light emitting section and 2 the moving mechanism 5 to irradiate, with a laser beam, the irradiation target region A included in a second region column 101G closest to the one region column 101R on the one side of the one region column 101R through the lens 421 included in any one of the lens columns 422 excluding the one lens column 422 in second or later scan, and controls the light emitting section 2 and the moving mechanism 5 to irradiate, with a laser beam, the irradiation target region A included in a second region column 101G closest to the one region column 101R on an opposite side to the one side of the one region column 101R through the lens 421 included in any one of the lens columns 422 excluding the one lens column 422 in the second or later scan.

In the laser annealing device 100 of the present embodiment, the control section 1 may control the light emitting section 2 and the moving mechanism 5 to irradiate, with a laser beam, the irradiation target region A included in a scan-end region column 101R among the plurality of first region columns 101R through the lens 421 included in a lens column 422 disposed at a first end among the plurality of lens columns 422 in the first scan, and may control the light emitting section 2 and the moving mechanism 5 to irradiate, with a laser beam, the irradiation target region A included in a first region column 101R closest to the scan-end region column 101R and not scanned yet through the lens 421 included in a lens column 422 disposed at a second end opposite to the first end among the plurality of lens columns 422.

In the laser annealing device 100 according to the present embodiment, the substrate 10 further includes a plurality of third region columns 101B disposed to be spaced from the first region columns 101R toward the one side at a third interval D3 smaller than the first interval D1, each irradiation target region A included in the first region columns 101R is a specific region of a thin film transistor of a pixel area PR of a first color, each irradiation target region A included in the second region columns 101G is a specific region of a thin film transistor of a pixel area PG of a second color, each irradiation target region A included in the third region columns 101B is a specific region of a thin film transistor of a pixel area PB of a third color, and the control section 1 may control the light emitting section 2 and the moving mechanism 5 to irradiate, with a laser beam, the irradiation target region A included in a third region column 101B closest to the one region column 101R on the one side of the one region column 101R through the lens 421 included in any one of the lens columns 422 in the second or later scan, and may control the light emitting section 2 and the moving mechanism 5 to irradiate, with a laser beam, the irradiation target region A included in a third region column 101B closest to the one region column 101R on the side opposite to the one side of the one region column 101R through the lens 421 included in any one of the lens columns 422 in the second or later scan.

In the laser annealing device 100 according to the present embodiment, the control section 1 may control the light emitting section 2 and the moving mechanism 5 to irradiate, with a laser beam, the irradiation target region A included in any plurality of target region columns 101R among the plurality of first region columns 101R in the first scan, may control the light emitting section 2 and the moving mechanism 5 to irradiate, with a laser beam, the irradiation target region A included in a second region column 101G closest to the target region column 101R on the one side of the target region column 101R in the second scan, may control the light emitting section 2 and the moving mechanism 5 to irradiate, with a laser beam, the irradiation target region A included in a third region column 101B closest to the target region column 101R on the one side of the target region column 101R in the third scan, and may control the light emitting section 2 and the moving mechanism 5 to irradiate, with a laser beam, the irradiation target region A included in the first region column 101R closest to a scan-end region column 101R among the target region columns 101R on the one side of the scan-end region column 101R through the lens 421 included in a lens column 422 disposed at an end opposite to the one side among the plurality of lens columns 422 in fourth or later scan.

The laser annealing method according to an embodiment is a laser annealing method for irradiating an irradiation target region A with a laser beam through a lens 421 while scanning a substrate 10 by an irradiation section in which a plurality of lens columns 422 each consisting of at least one lens 421 are disposed at a first interval D1, the substrate 10 including region columns 101 each consisting of at least one irradiation target region A, the region columns 101 including a plurality of first region columns 101R disposed at the first interval D1, and a plurality of second region columns 101G disposed to be spaced from the first region columns 101R at a second interval D2 smaller than the first interval D1 toward one side in a perpendicular direction to the region columns 101, the laser annealing method including: while causing the irradiation section 4 to scan the substrate 10 by relatively moving the irradiation section 4 and the substrate 10 in a column direction along the lens columns 422 with the column direction accorded with a direction along the region columns 101 for irradiating, with a laser beam, the irradiation target region A included in each of the region columns 101 disposed in positions corresponding to any one of the lens columns 422 through a lens 421 included in a lens column 422 corresponding to the region column 101; irradiating, with a laser beam, the irradiation target region A included in one non-scan-end region column 101R among the plurality of first region columns 101R through the lens 421 included in one lens column 422 among the plurality of lens columns 422 in first scan; irradiating, with a laser beam, the irradiation target region A included in a second region column 101G closest to the one region column 101R on the one side of the one region column 101R through the lens 421 included in any one of the lens columns 422 excluding the one lens column 422 in second or later scan; and irradiating, with a laser beam, the irradiation target region A included in a second region column closest to the one region column on an opposite side to the one side of the one region column 101G through the lens 421 included in any one of the lens columns 422 excluding the one lens column 422 in the second or later scan.

According to the laser annealing device and the laser annealing method of the present embodiment, the position of the seam in regard to the first region column 101R (the pixel area PR of the first color) and the position of the seam in regard to the second region column 101G (the pixel area PG of the second color) can be shifted from each other, and hence, as compared with the conventional technique in which the positions of these two seams are the same, the seam between the partial regions 7 set in performing the laser annealing can be made difficult to be visually recognized by a user.

REFERENCE SIGNS LIST

1 control section
2 light source
4 irradiation section
5 drive section
6 table section
10 glass substrate
42 microlens array
100 laser annealing device
101 region column
421 microlens
422 microlens column

The invention claimed is:

1. A laser annealing device, comprising an irradiation section in which a plurality of lens columns each consisting of at least one lens are disposed at a first interval, for irradiating an irradiation target region with a laser beam through the lens while scanning a substrate by the irradiation section, the substrate including region columns each consisting of at least one irradiation target region, the region columns including a plurality of first region columns disposed at the first interval, and a plurality of second region columns disposed to be spaced from the first region columns at a second interval smaller than the first interval toward one side in a perpendicular direction to the region columns, the laser annealing device comprising:

a light emitting section emitting a laser beam to be caused to enter the lens;

a moving mechanism relatively moving the irradiation section and the substrate in a column direction along the lens columns with the column direction accorded with a direction along the region columns; and a control section controlling the light emitting section and the moving mechanism to irradiate, with a laser beam, the irradiation target region included in each of the region columns disposed in positions corresponding to any one of the lens columns through a lens included in a lens column corresponding to the region column while causing the irradiation section to scan the substrate in the column direction, wherein the control section controls the light emitting section and the moving mechanism to irradiate, with a laser beam, the irradiation target region included in one region column of a non-scan end among the plurality of first region columns through the lens included in one lens column among the plurality of lens columns disposed at the first interval in first scan, controls the light emitting section and the moving mechanism to irradiate, with a laser beam, the irradiation target region included in a second region column closest to the one region column on the one side of the one region column through the lens included in any one of the lens columns excluding the one lens column among the plurality of lens columns in second or later scan, and controls the light emitting section and the moving mechanism to irradiate, with a laser beam, the irradiation target region included in a second region column closest to the one region column on an opposite side to the one side of the one region column through the lens included in any one of the lens columns excluding the one lens column among the plurality of lens columns in the second or later scan.

2. The laser annealing device according to claim 1, wherein the control section controls the light emitting section and the moving mechanism to irradiate, with a laser beam, the irradiation target region included in a scan-end region column among the plurality of first region columns through the lens included in a lens column disposed at a first end among the plurality of lens columns in the first scan, and controls the light emitting section and the moving mechanism to irradiate, with a laser beam, the irradiation target region included in a first region column closest to the scan-end region column and not scanned yet through the lens included in a lens column disposed at a second end opposite to the first end among the plurality of lens columns.

3. The laser annealing device according to claim 1,
wherein the substrate further includes a plurality of third region columns disposed to be spaced from the first region columns toward the one side at a third interval smaller than the first interval,
each irradiation target region included in the first region columns is a specific region of a thin film transistor of a pixel area of a first color,
each irradiation target region included in the second region columns is a specific region of a thin film transistor of a pixel area of a second color,
each irradiation target region included in the third region columns is a specific region of a thin film transistor of a pixel area of a third color, and
the control section controls the light emitting section and the moving mechanism to irradiate, with a laser beam, the irradiation target region included in a third region column closest to the one region column on the one side of the one region column through the lens included in any one lens column among the plurality of lens columns in the second or later scan, and controls the light emitting section and the moving mechanism to irradiate, with a laser beam, the irradiation target region included in a third region column closest to the one region column on the side opposite to the one side of the one region column through the lens included in any one lens column among the plurality of lens columns in the second or later scan.

4. The laser annealing device according to claim 3,
wherein the control section controls the light emitting section and the moving mechanism to irradiate, with a laser beam, the irradiation target region included in any plurality of target region columns among the plurality of first region columns in the first scan, controls the light emitting section and the moving mechanism to irradiate, with a laser beam, the irradiation target region included in a second region column closest to the target region column on the one side of the target region column in the second scan, controls the light emitting section and the moving mechanism to irradiate, with a laser beam, the irradiation target region included in a third region column closest to the target region column on the one side of the target region column in the third scan, and controls the light emitting section and the moving mechanism to irradiate, with a laser beam, the irradiation target region included in a first region column closest to a scan-end region column among the target region columns on the one side of the scan-end region column through the lens included in a lens column disposed at an end opposite to the one side among the plurality of lens columns in fourth or later scan.

5. A laser annealing method for irradiating an irradiation target region with a laser beam through a lens while scanning a substrate by an irradiation section in which a plurality of lens columns each consisting of at least one lens are disposed at a first interval, the substrate including region columns each consisting of at least one irradiation target region, the region columns including a plurality of first region columns disposed at the first interval, and a plurality of second region columns disposed to be spaced from the first region columns at a second interval smaller than the first interval toward one side in a perpendicular direction to the region columns, the laser annealing method comprising:
while causing the irradiation section to scan the substrate by relatively moving the irradiation section and the substrate in a column direction along the lens columns with the column direction accorded with a direction along the region columns for irradiating, with a laser beam, the irradiation target region included in each of the region columns disposed in positions corresponding to any one of the lens columns through a lens included in a lens column corresponding to the region column;
irradiating, with a laser beam, the irradiation target region included in one region column of a non-scan end among the plurality of first region columns through the lens included in one lens column among a plurality of lens columns disposed at the first interval in first scan;
irradiating, with a laser beam, the irradiation target region included in a second region column closest to the one region column on the one side of the one region column through the lens included in any one of the lens columns excluding the one lens column among the plurality of lens columns in second or later scan; and
irradiating, with a laser beam, the irradiation target region included in a second region column closest to the one region column on an opposite side to the one side of the one region column through the lens included in any one of the lens columns excluding the one lens column among the plurality of lens columns in the second or later scan.

* * * * *